(12) United States Patent
Israel

(10) Patent No.: US 6,342,688 B1
(45) Date of Patent: Jan. 29, 2002

(54) METHOD FOR PREPARING IRIDIUM CRUCIBLES FOR CRYSTAL GROWTH

(75) Inventor: John T. Israel, Knoxville, TN (US)

(73) Assignee: CTI, Inc., Knoxville, TN (US)

( * ) Notice: Subject to any disclaimer, the term of this patent is extended or adjusted under 35 U.S.C. 154(b) by 50 days.

(21) Appl. No.: 09/590,873

(22) Filed: Jun. 9, 2000

(51) Int. Cl.⁷ .............................................. B23K 9/04
(52) U.S. Cl. ........................... 219/137 WM; 219/76.15
(58) Field of Search ................................ 219/137 WM, 219/130.51, 137 R, 76.15, 76.16, 75, 121.85; 117/220, 900; 148/512

(56) References Cited

U.S. PATENT DOCUMENTS

| | | | |
|---|---|---|---|
| 3,231,430 A | * 1/1966 | Krieger et al. | 148/512 |
| 4,294,631 A | * 10/1981 | Anthony et al. | 219/121.85 |
| 4,444,728 A | * 4/1984 | Lanam et al. | 117/900 |
| 4,562,332 A | * 12/1985 | Walter et al. | 148/512 |
| 5,443,201 A | * 8/1995 | Cartry | 219/76.16 |
| 5,993,545 A | * 11/1999 | Lupton et al. | 117/220 |

* cited by examiner

Primary Examiner—Clifford C. Shaw
(74) Attorney, Agent, or Firm—Pitts & Brittian, P.C.

(57) ABSTRACT

A method of preparing an iridium crucible for crystal growth. As a form of preventive maintenance or during a repair, an iridium crucible is prepared by a method of surface conditioning by way of weld puddling the entire surface of the bottom or on the sidewalls from the bottom up to a height sufficient to include the depth of the residual crystal material after pulling of a crystal or both. In this regard, the surface of the iridium crucible is pulse welded so as to puddle a small portion of the surface without penetrating the side or bottom wall. In the preferred embodiment, the entire surface of the bottom of the iridium crucible is conditioned by weld melting. Similarly, the sidewalls are similarly conditioned by way of weld puddling such as by a pulsating welder. It will be recognized that any state of the art welding apparatus, such as a GTAW welder, TIG welder, laser welder or the like, that generates temperatures sufficient to melt iridium while controlling the depth of penetration can be utilized.

18 Claims, 5 Drawing Sheets

METHOD FOR PREPARING IRIDIUM CRUCIBLES FOR CRYSTAL GROWTH

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of Invention

This invention relates to a method of preparing iridium crucibles for use in crystal growth. More specifically it relates to a method of surface conditioning by way of weld melting, or weld puddling, such as by a pulsating welder, such as a GTAW welder, TIG welder, laser welder or the like, for the purpose of reducing grain boundary size in the crucible which lead to leakage, cracking and a reduction in the useable life of the iridium crucible during production of crystals such as the YAG laser crystal and scintillation crystals, including Lutetium Oxyorthosilicate (LSO) crystals.

2. Description of the Related Art

Devices for detecting the distribution of gamma rays transmitted or emitted through objects to study the compositions or functions of the objects are well known to the art. The techniques referred to as Emission Computed Tomography can be divided into two specific classes; Single Photon Emission Computed Tomography (SPECT) uses radiotracers which emit gamma rays but do not emit positrons and Positron Emission Tomography (PET) which uses radiotracers that emit positrons. In either discipline, scintillation crystals are utilized to detect the emitted gamma rays. One such scintillation crystal is composed of Lutetium Oxyorthosilicate (LSO). Scintillation crystals, such as LSO crystals, and other crystals, such as the YAG laser crystal, are known to be grown using the Czochralski technique. Simply stated and with reference to LSO, in this technique, LSO is melted in an iridium crucible. An LSO seed crystal is inserted in the molten LSO and the new crystal is pulled from the molten LSO. After pulling the crystal, the residual LSO cools and hardens in the iridium crucible. As the residual LSO cools, it expands thereby placing stress on the iridium crucible. It is known that the re-freezing of the molten LSO causes the sidewalls to swell or bulge outward under the pressure of the expanding LSO. The hardened LSO must then be removed from the iridium crucible. Then, the iridium crucible is inspected for cracking and repaired as necessary. Those skilled in the art recognize that repeated use of the iridium crucible causes grain boundaries to become larger and more distinct, resulting in increased risk of molten lutetium leaking through the enlarged grain boundaries. Further, growth of the grain boundaries often leads to cracking of the iridium crucible. Those skilled in the art recognize that growth of grain boundaries is a problem with wrought iridium crucibles as well as electroformed iridium crucibles. It will also be recognized that iridium crucibles are exposed to the same or similar stresses when used in conjunction with growth of other crystals.

Initially, leakage and cracking were repaired, as necessary, by a process of welding or weld melting the affected area on either the exterior or the interior of the used crucible. In this regard, it has been found that weld melting melts grains of iridium into smaller grains simultaneously repairing the defect and reducing grain boundary size. This led to the observation and discovery that welding reduced propagation of the grain boundaries inasmuch as it was observed that grain boundaries did not readily grow into the welded area. Those skilled in the art will recognize that iridium crucibles are expensive, that repair time takes the iridium crucible out of LSO crystal production, and that growth of grain boundaries shortens the useful life span of an iridium crucible.

Accordingly, there is a need for a method of conditioning the surface of iridium crucibles by weld melting the surface as either a form of preventive maintenance or repair to reduce the propagation of growth boundaries and thereby reduce the amount of time spent repairing an iridium crucible and further increase the useful life span of an iridium crucible.

It is therefore an object of the present invention to provide a method of preparing iridium crucibles for use in growing crystals by conditioning the surface of the bottom of the crucible, the surface of the sides of the crucible or both by way of weld melting, or puddling, the surface such as by a pulse welder.

It is another object of the present invention to provide a method of repairing iridium crucibles by conditioning the surface of the bottom of the crucible, the surface of the sides of the crucible or both by way of weld melting, or puddling, the surface such as by a pulse welder.

Other objects and advantages over the prior art will become apparent to those skilled in the art upon reading the detailed description together with the drawings as described as follows.

BRIEF SUMMARY OF THE INVENTION

In accordance with the teachings of the present invention an iridium crucible is welded on either the entire surface of the bottom, the surface of the sidewalls from the bottom up to a height sufficient to include the depth of the residual molten crystal material after pulling of a crystal, or both the surfaces of the bottom and sidewalls. In this regard, the iridium crucible is pulse welded so as to puddle a small portion of the surface without substantially penetrating the side or bottom wall. It will be understood that the terms weld melting and weld puddling are used to describe the process of pulse welding the surface without substantially penetrating the surface. In the preferred embodiment, the bottom of the iridium crucible is conditioned by way of weld puddling such as by a pulsating welder. Similarly, the sidewalls are circumscribed by a pattern of pulsed weld puddling in a helical fashion. It will be recognized that other patterns of pulsed weld puddling are possible so long as a substantial portion of the bottom and the sidewalls are weld melted as described herein. Further it will be recognized that any state of the art welding apparatus, such as a GTAW welder or laser welder, that generates temperatures sufficient to melt iridium while controlling the depth of penetration can be utilized.

BRIEF DESCRIPTION OF THE SEVERAL VIEWS OF THE DRAWINGS

The above-mentioned features of the invention will become more clearly understood from the following detailed description of the invention read together with the drawings in which.

DETAILED DESCRIPTION OF THE INVENTION

Figure 1:
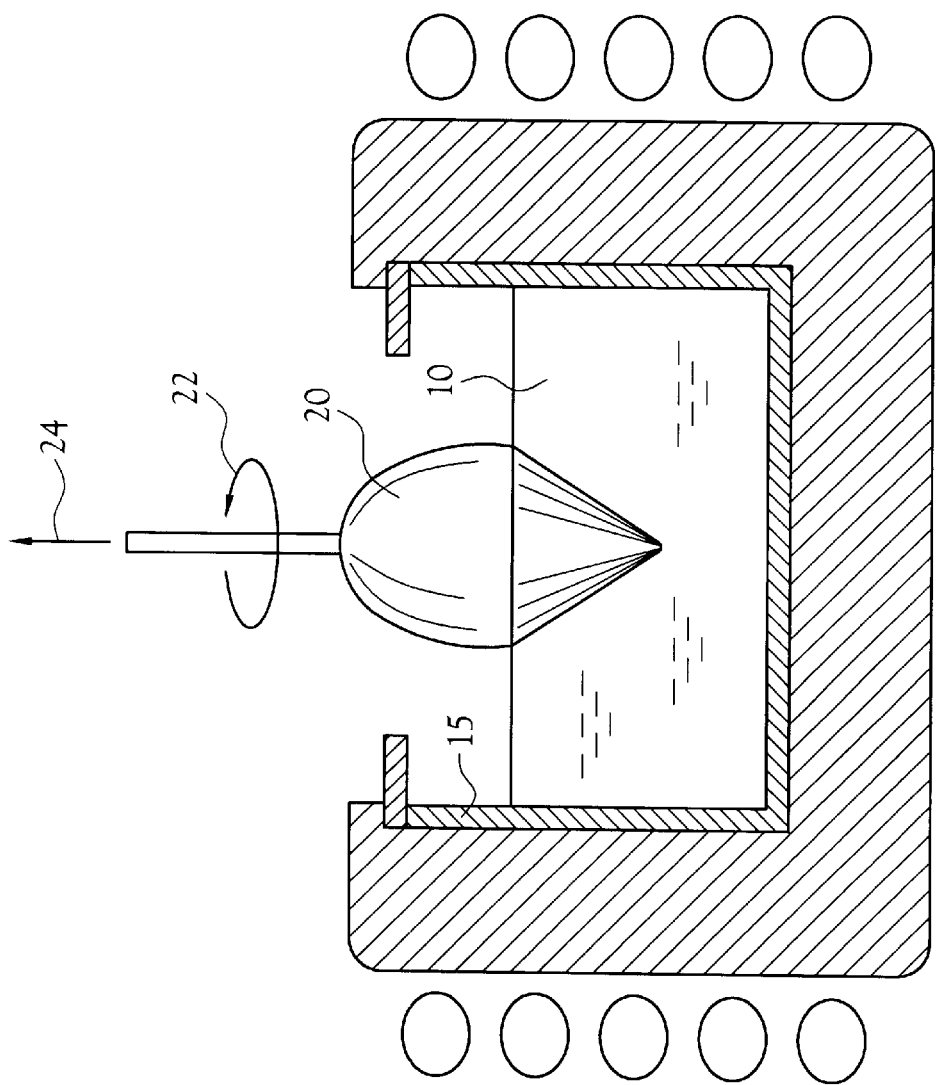
FIG. 1 is schematic view depicting the Czochralski technique of growing crystals such as LSO scintillation crystals.
Figure 2:
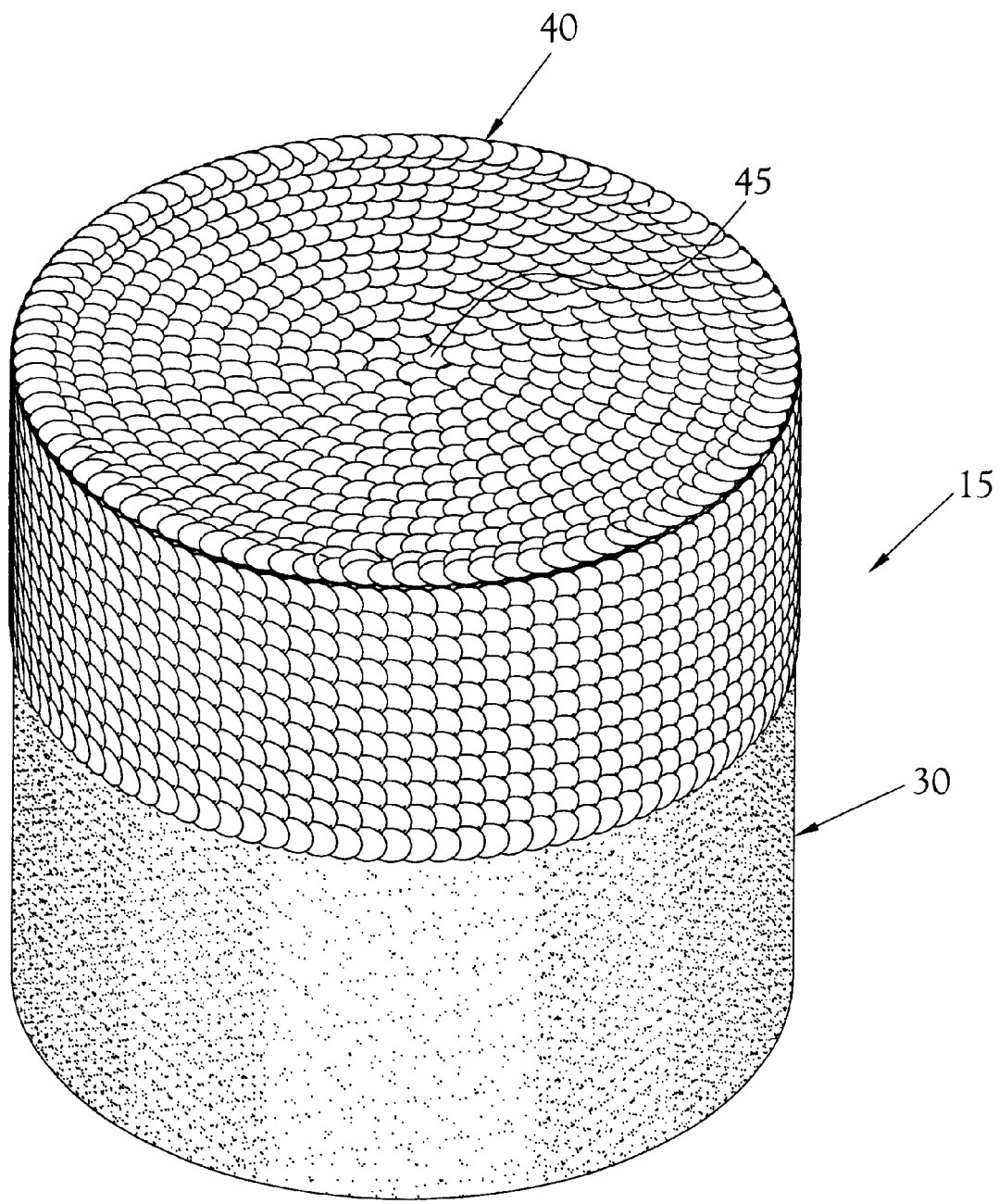
FIG. 2 is a perspective view of an inverted crucible showing the preferred welding pattern.

It is known by those skilled in the art that many types of crystals, such as the YAG laser crystal and scintillation crystals such as LSO crystals are often grown according to the Czochralski technique depicted schematically in FIG. 1. In this regard, and very simply stated, molten crystal material, such as LSO 10, is contained in a crucible 15. A seed crystal 20 is inserted in the molten crystal material and the new crystal is rotated, as depicted by arrow 22, at a selected speed and pulled, as depicted by arrow 24, at a second selected speed from the molten crystal material 10. After pulling the crystal, the residual crystal material cools and hardens in the crucible 15. Because of the high melting point various crystals, e.g. the melting point of LSO is approximately 2070° C., the crucible 15 must be formed of an extremely high melting point material. In this regard, the preferred crucible material is iridium, having a melting point of approximately 2410° C. It will be understood by those skilled in the art that an iridium crucible includes, in the preferred embodiment, cylindrical sidewalls 30 and a bottom wall 40. In order to reduce growth and propagation of grain boundaries within the metal of the iridium crucible, a substantial amount of surface area of a selected wall is conditioned by weld melting. It will be understood that conditioning a substantial amount of surface area, such as the entire surface of the bottom wall, or the circumference of the sidewalls to a selected height is a more comprehensive treatment of the crucible than merely repairing a cracked or similarly defected area of the crucible. In this regard, the iridium crucible is conditioned by weld melting, or puddling, the entire surface of the bottom wall 40 and on the sidewalls 30 from the bottom up to a height sufficient to include the depth of the residual crystal material after pulling of a crystal. It will be understood that the preferred embodiment is to condition the surface of both the bottom wall 40 and the sidewall 30. However, in alternate embodiments, the surface conditioning could be limited to only the surface of the bottom wall 40 or the surface of the sidewall 30. In the preferred embodiment this surface conditioning serves as preventive maintenance and is applied to new crucibles prior to being used in crystal growth. However, it will be appreciated by those skilled in the art that the surface conditioning can be applied to used crucibles as a means of extending the interval between necessary repairs and as a comprehensive repair method. In the preferred embodiment the sidewalls 30 are welded to a height of between 2 inches and 3 inches from the bottom of the iridium crucible 15. In an alternate embodiment, the entire height of the sidewall 30 can be welded.

Figure 3:
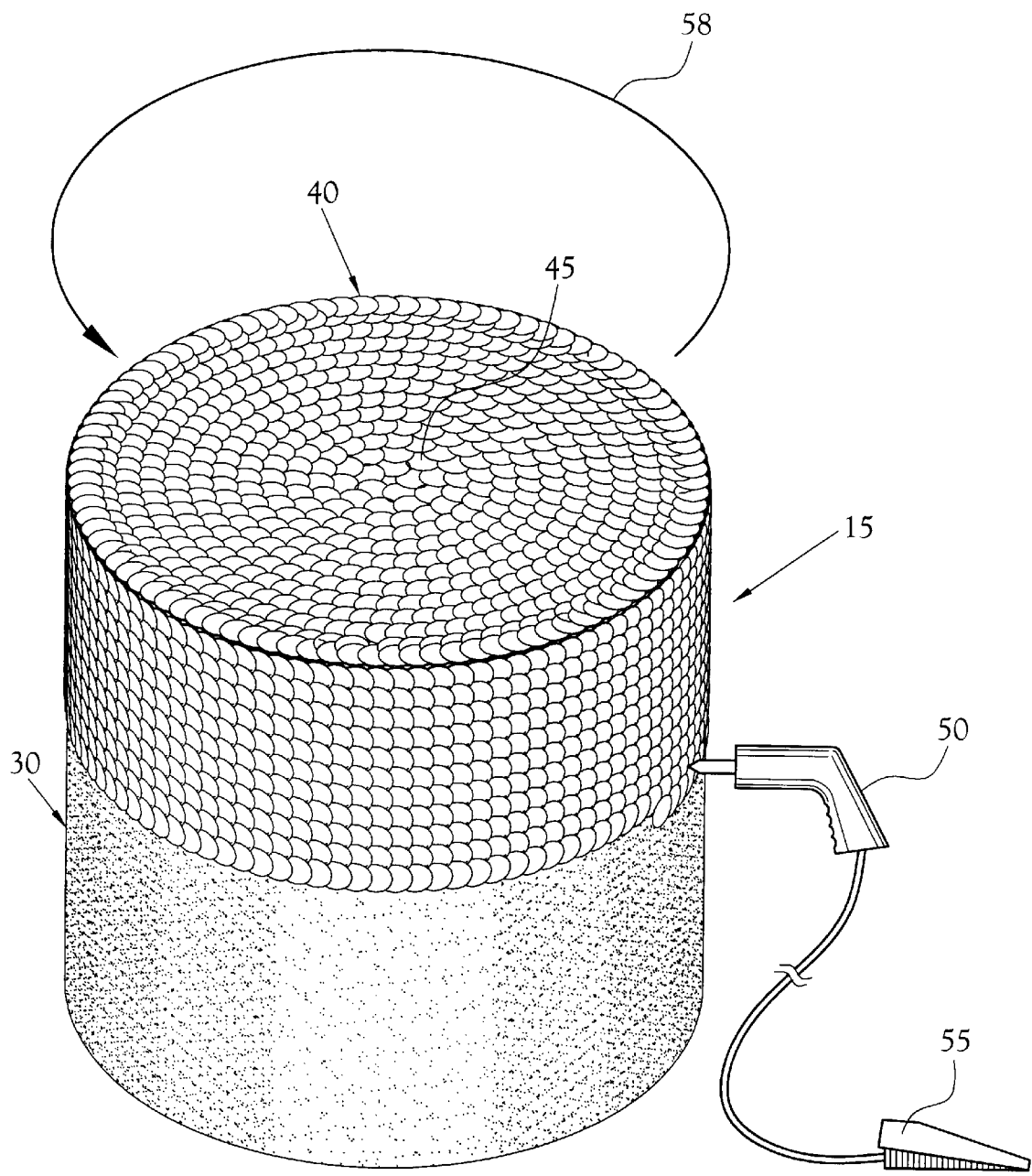
FIG. 3 is another perspective view illustrating in schematic fashion the preferred method of weld melting a selected portion of the surface of the iridium crucible.
Figure 4:
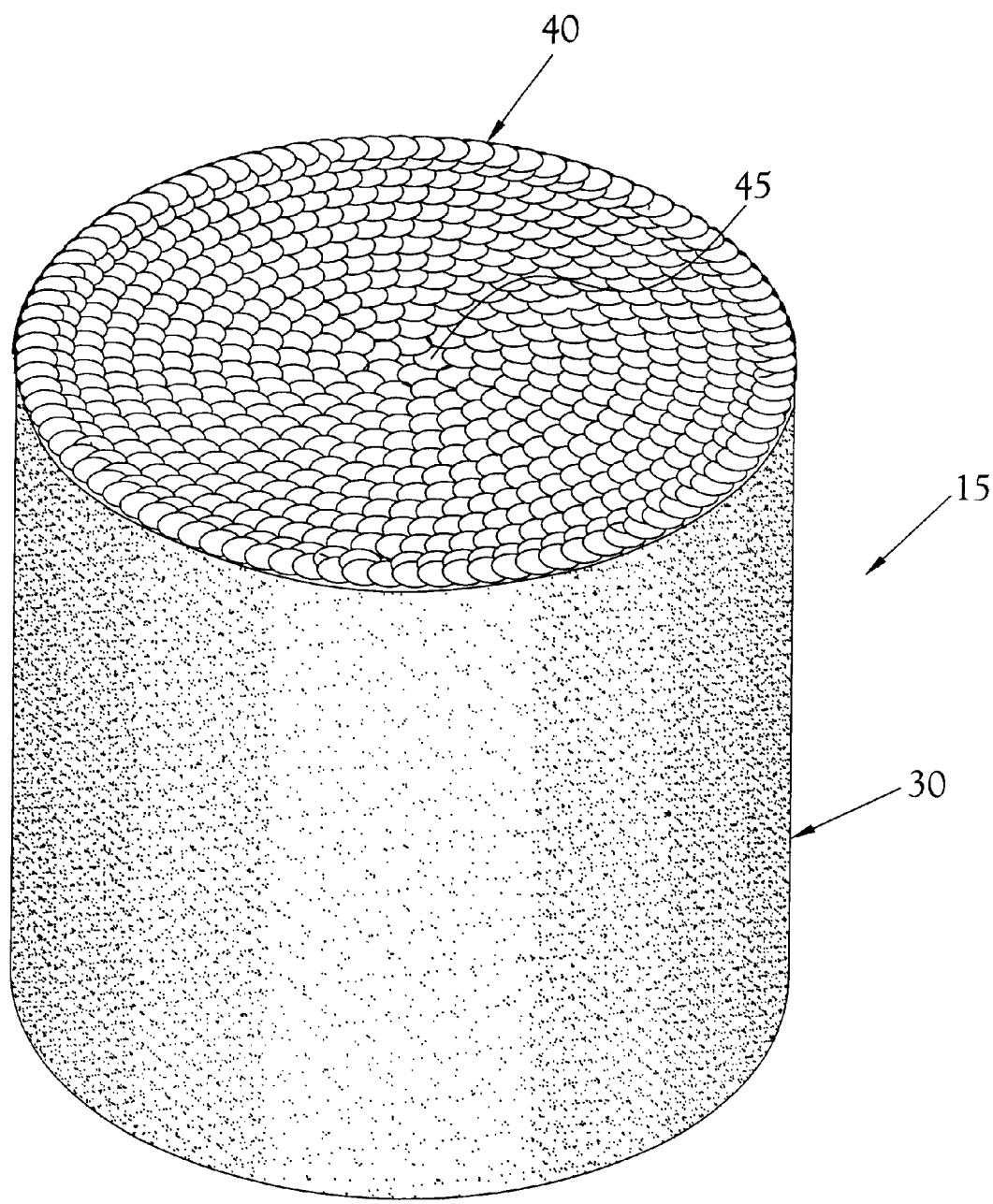
FIG. 4 is a perspective view of an inverted crucible showing the bottom wall being conditioned in accordance with the present method.
Figure 5:
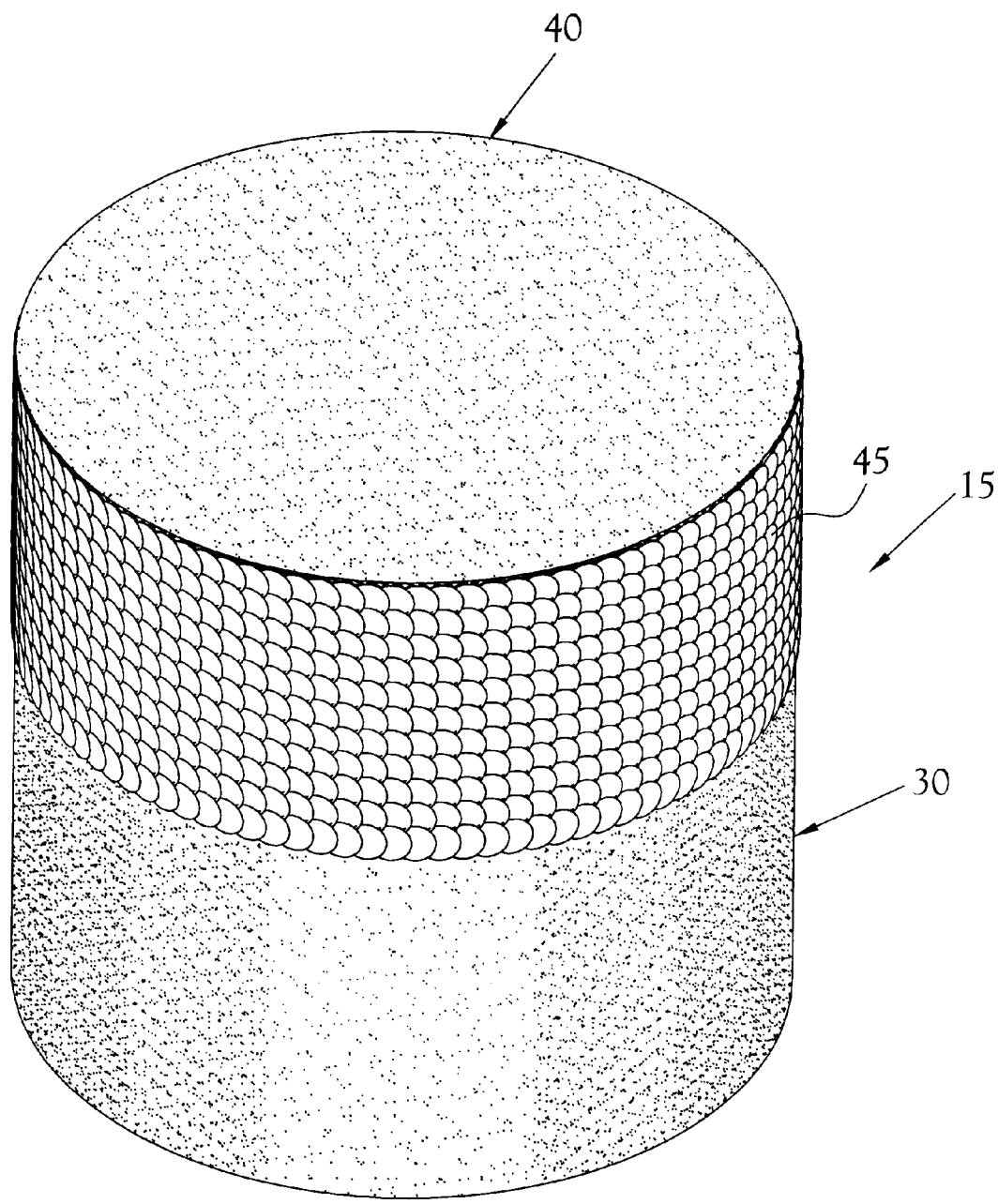
FIG. 5 is a perspective view of an inverted crucible showing the sidewall being conditioned in accordance with the present method.

In the preferred embodiment, a Miller® Synchrowave® 351 TIG (gas arc tungsten) welder, depicted generically at 50 in FIG. 3, is used. During the process of continuously weld melting the surface, the amperage is pulsed from a minimum amperage of approximately 200 amps, which is insufficient to melt the iridium to a maximum of approximately 400 amps which is sufficient to melt iridium and allow control of the depth of penetration of the puddling. It will be understood that a minimum amperage phase followed by a maximum amperage phase constitutes one pulse cycle. In one embodiment this pulsing of the amperage is controlled by a foot controller 55. However, those skilled in the art will recognize that other mechanisms could be utilized to manually pulse the amperage and that automated pulsing could be utilized. It will also be recognized that other welders and other types of welders, including laser welders could be utilized. During the process of weld melting the surface, the iridium crucible is rotated as shown by arrow 58. This rotation and pulsing results in the classic "stacked quarters" appearance of individual areas of puddling 45. In the preferred embodiment, the surface is weld melted without substantially penetrating the side or bottom wall. It will be understood that prolonged duration of the maximum amperage, or melting, phase of the pulse cycle will result sequentially in puddling as the wall is penetrated to a given depth and ultimately substantial or complete penetration of the wall. In the preferred embodiment, the melting phase of the pulse cycle is halted upon observation of puddling so as to prevent substantial or complete penetration of the wall. Using this preferred pulse cycle, the entire surface of bottom wall 40 of the iridium crucible 15 is weld puddled. Similarly, the entire circumference of the sidewall 30 is weld puddled to a selected height on the sidewall 30. It will be recognized that there are numerous patterns of weld melting that can be utilized to surface condition the areas of the sidewalls 30 and the bottom wall 40 described herein. Further as stated above, it will be recognized that such weld melting can by accomplished by a pulsating GTAW/TIG welder, laser welder or similar welder capable of generating temperatures sufficient to melt iridium while controlling the depth of penetration are sufficient. Moreover, the iridium crucible 15 can be manually rotated during the welding process or can be mounted and slowly turned on a lathe, or similar machine with manual or automated pulse welding.

From the foregoing description, it will be recognized by those skilled in the art that a method for preparing iridium crucibles for crystal growth offering advantages over the prior art has been provided. Specifically, the present invention provides a method of conditioning the surface of iridium crucibles by weld puddling and thereby preparing the iridium crucibles for use in growing crystals. Further, the present invention provides a method of surface conditioning that can be utilized prior to the iridium crucible being placed in production or as a comprehensive repair technique for iridium crucibles that have been used in crystal growth.

While a preferred embodiment has been shown and described, it will be understood that it is not intended to limit the disclosure, but rather it is intended to cover all modifications and alternate methods falling within the spirit and the scope of the invention as defined in the appended claims.

I claim:

1. A method of treating an iridium crucible having a bottom wall and at least one sidewall in order to reduce growth and propagation of metal grain boundaries in the walls of the iridium crucible, said method comprising the steps:

conditioning a substantial amount of surface area of a selected wall of the crucible by weld melting a selected portion of said wall to a selected depth of penetration.

2. The method of claim 1 wherein said selected wall is said bottom wall and said selected portion of said wall substantially covers said bottom wall.

3. The method of claim 1 wherein said selected wall is said side wall and said selected portion of said wall substantially circumscribes said crucible and begins at a lower portion of said sidewall proximate a junction of said sidewall and said bottom wall and extends upward a selected height.

4. The method of claim 1 wherein said weld melting is accomplished by pulse welding, wherein said welding is pulsed from a minimum amperage phase to a maximum amperage phase, a minimum amperage phase followed by a maximum amperage phase defining a pulse cycle, wherein said minimum amperage is not sufficient to melt said surface of said crucible and said maximum amperage is sufficient to melt said surface of said crucible.

5. The method of claim 4 wherein prolonged duration of said maximum amperage phase of a pulse cycle will sequentially result in puddling a small region of said surface area and substantial penetration of said wall;

observing said selected portion for puddling;

halting said maximum amperage phase upon said observation of said puddling and prior to said substantial penetration of said wall.

6. The method of claim 1 wherein said method is accomplished using a gas tungsten arc welder.

7. The method of claim 1 wherein said crucibles are used for growth of scintillation crystals.

8. The method of claim 1 wherein said crucibles are used for growth of Lutetium Oxyorthosilicate scintillation crystals.

9. A method of treating an iridium crucible having a bottom wall and at least one sidewall in order to reduce growth and propagation of metal grain boundaries in the walls of the iridium crucible, said method comprising the steps:

conditioning a surface of said bottom wall by weld melting a selected portion of said surface of said bottom wall to a selected depth of penetration wherein said selected portion of said wall substantially covers said bottom wall; and conditioning a surface of said side wall by weld melting a selected portion of said surface of said sidewall to a selected depth of penetration wherein said selected portion of said wall substantially circumscribes said crucible and begins at a lower portion of said sidewall proximate a junction of said sidewall and said bottom wall and extends upward a selected height.

10. The method of claim 1 wherein said weld melting is accomplished by pulse welding, wherein said welding is pulsed from a minimum amperage phase to a maximum amperage phase, a minimum amperage phase followed by a maximum amperage phase defining a pulse cycle, wherein said minimum amperage is not sufficient to melt said surface of said crucible and said maximum amperage is sufficient to melt said surface of said crucible.

11. The method of claim 10 wherein prolonged duration of said maximum amperage phase of a pulse cycle will sequentially result in puddling a small region of said surface area and substantial penetration of said wall;

observing said selected portion for puddling;

halting said maximum amperage phase upon said observation of said puddling and prior to said substantial penetration of said wall.

12. The method of claim 9 wherein said method is accomplished using a gas tungsten arc welder.

13. The method of claim 9 wherein said crucibles are used for growth of scintillation crystals.

14. The method of claim 9 wherein said crucibles are used for growth of Lutetium Oxyorthosilicate scintillation crystals.

15. A method of treating an iridium crucible having a bottom wall and at least one sidewall in order to reduce growth and propagation of metal grain boundaries in the walls of the iridium crucible, said method comprising the steps:

conditioning a surface of said bottom wall by weld melting a selected portion of said surface of said bottom wall to a selected depth of penetration wherein said selected portion of said wall substantially covers said bottom wall; and conditioning a surface of said side wall by weld melting a selected portion of said surface of said sidewall to a selected depth of penetration wherein said selected portion of said wall substantially circumscribes said crucible and begins at a lower portion of said sidewall proximate a junction of said sidewall and said bottom wall and extends upward a selected height;

said weld melting being accomplished by pulse welding, wherein said welding is pulsed from a. minimum amperage phase to a maximum amperage phase, a minimum amperage phase followed by a maximum amperage phase defining a pulse cycle, wherein said minimum amperage is not sufficient to melt said surface of said crucible and said maximum amperage is sufficient to melt said surface of said crucible, and further wherein prolonged duration of said maximum amperage phase of a pulse cycle will sequentially result in puddling a small region of said surface area and substantial penetration of said wall;

observing said selected portion for puddling;

halting said maximum amperage phase upon said observation of said puddling and prior to said substantial penetration of said wall.

16. The method of claim 15 wherein said method is accomplished using a gas tungsten arc welder.

17. The method of claim 15 wherein said crucibles are used for growth of scintillation crystals.

18. The method of claim 15 wherein said crucibles are used for growth of Lutetium Oxyorthosilicate scintillation crystals.

* * * * *